US009905506B2

(12) United States Patent
Bernstein et al.

(10) Patent No.: US 9,905,506 B2
(45) Date of Patent: *Feb. 27, 2018

(54) ASSEMBLY INCLUDING PLURAL THROUGH WAFER VIAS, METHOD OF COOLING THE ASSEMBLY AND METHOD OF FABRICATING THE ASSEMBLY

(71) Applicant: INTERNATIONAL BUSINESS MACHINES CORPORATION, Armonk, NY (US)

(72) Inventors: Kerry Bernstein, Underhill, VT (US); Thomas Brunschwiler, Thalwil (CH); Bruno Michel, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

This patent is subject to a terminal disclaimer.

(21) Appl. No.: 14/924,324

(22) Filed: Oct. 27, 2015

(65) Prior Publication Data

US 2016/0049360 A1 Feb. 18, 2016

Related U.S. Application Data

(60) Continuation of application No. 14/096,702, filed on Dec. 4, 2013, now Pat. No. 9,252,071, which is a
(Continued)

(51) Int. Cl.
*H01L 23/34* (2006.01)
*H01L 23/498* (2006.01)
(Continued)

(52) U.S. Cl.
CPC ........ *H01L 23/49827* (2013.01); *H01L 23/46* (2013.01); *H01L 23/473* (2013.01);
(Continued)

(58) Field of Classification Search
CPC . H01L 23/473; H01L 23/49827; H01L 23/46; H01L 25/0657
See application file for complete search history.

(56) References Cited

U.S. PATENT DOCUMENTS 5,199,165 A 4/1993 Crawford et al.
5,309,318 A 5/1994 Beilstein et al.
(Continued)

OTHER PUBLICATIONS

United States Office Action dated Jun. 8, 2015 in the U.S. Appl. 14/096,729.
(Continued)

*Primary Examiner* — Trung Q Dang
(74) *Attorney, Agent, or Firm* — Vazken Alexanian; McGinn IP Law Group, PLLC

(57) ABSTRACT

An assembly includes a chip including an integrated circuit, a casing including an integrated circuit and including an upper portion formed on a side of the chip, a lower portion formed on another side of the chip, and a cooling inlet and a cooling outlet for transferring a coolant, provided in an upper surface of the casing, and forming outer sidewalls of the upper portion and inner sidewalls of the lower portion, plural through-wafer vias (TWVs) for electrically connecting the integrated circuit of the chip and the integrated circuit of the casing, and a card connected to the casing for electrically connecting the casing to a system board. The card includes an upper card connected to the upper portion of the casing, and a lower card connected to the lower portion of the casing.

19 Claims, 9 Drawing Sheets

Related U.S. Application Data division of application No. 12/544,365, filed on Aug. 20, 2009, now Pat. No. 8,629,554, which is a division of application No. 11/933,107, filed on Oct. 31, 2007, now Pat. No. 8,106,505.

(51) Int. Cl.
  *H01L 23/473* (2006.01)
  *H01L 25/065* (2006.01)
  *H01L 23/46* (2006.01)

(52) U.S. Cl.
  CPC ...... *H01L 25/0657* (2013.01); *H01L 2224/16* (2013.01); *H01L 2225/06541* (2013.01); *H01L 2225/06589* (2013.01); *H01L 2924/15159* (2013.01); *H01L 2924/3011* (2013.01)

(56) References Cited

U.S. PATENT DOCUMENTS

| | | |
|---|---|---|
| 5,361,188 A | 11/1994 | Kondou et al. |
| 5,380,956 A | 1/1995 | Loo et al. |
| 5,495,397 A | 2/1996 | Davidson et al. |
| 5,783,870 A | 7/1998 | Mostafazadeh et al. |
| 5,817,986 A | 10/1998 | Davidson et al. |
| 6,014,313 A | 1/2000 | Hesselbom |
| 6,265,771 B1 | 7/2001 | Ference et al. |
| 6,301,114 B1 | 10/2001 | Ootani |
| 6,414,391 B1 | 7/2002 | Corisis et al. |
| 6,451,626 B1 | 9/2002 | Lin |
| 6,459,581 B1 | 10/2002 | Newton et al. |
| 6,611,057 B2 | 8/2003 | Mikubo et al. |
| 6,717,812 B1 | 4/2004 | Pinjala et al. |
| 6,922,338 B2 | 7/2005 | Poechmueller |
| 7,029,951 B2 | 4/2006 | Chen et al. |
| 7,091,604 B2 | 8/2006 | Wylie et al. |
| 7,230,334 B2 | 6/2007 | Andry et al. |
| 7,432,592 B2 * | 10/2008 | Shi .................. H01L 23/473 257/714 |
| 9,252,071 B2 * | 2/2016 | Bernstein ............ H01L 23/473 |
| 9,252,072 B2 | 2/2016 | Bernstein |
| 2002/0008325 A1 | 1/2002 | Tominaga |
| 2004/0197953 A1 | 10/2004 | Funk |
| 2005/0059377 A1 * | 3/2005 | Schucker ................ H04B 1/28 455/334 |
| 2006/0129755 A1 | 6/2006 | Raghuram |
| 2006/0151206 A1 | 7/2006 | Maruyama et al. |
| 2006/0220210 A1 | 10/2006 | Karnezos et al. |
| 2008/0088031 A1 | 4/2008 | Kwon et al. |

OTHER PUBLICATIONS

United States Office Action dated Feb. 19, 2015 in the U.S. Appl. 14/096,729.
United States Office Action dated Feb. 23, 2015 in the U.S. Appl. 14/096,702.
United States Office Action dated Jun. 9, 2015 in the U.S. Appl. 14/096,702.
United States Notice of Allowance dated Sep. 29, 2015 in the U.S. Appl. 14/096,702.
A.M. Palagonia, "Method for Cooling a Stack of Laminated Chips", vol. 39, No. 11, Nov. 1996, IBM Technical Disclosure Bulletin, pp. 151-152.
Office Action dated Apr. 26, 2011 in U.S. Appl. No. 12/544,365.
Office Action dated Aug. 17, 2011 in U.S. Appl. No. 12/544,365.
Office Action dated Sep. 25, 2012 in U.S. Appl. No. 12/544,365.
Office Action dated Feb. 25,2013 in U.S. Appl. No. 12/544,365.
Notice of Allowance dated Aug. 26, 2013 in U.S. Appl. No. 12/544,365.
United States Office Action dated Jan. 11, 2017 in U.S. Appl. No. 14/924,256.
United States Office Action dated Jul. 13, 2017 in U.S. Appl. No. 14/924,256.

\* cited by examiner

ASSEMBLY INCLUDING PLURAL THROUGH WAFER VIAS, METHOD OF COOLING THE ASSEMBLY AND METHOD OF FABRICATING THE ASSEMBLY

RELATED APPLICATIONS

The present application is a Continuation application of U.S. patent application Ser. No. 14/096,702, filed on Dec. 4, 2013, which was a Divisional application of U.S. patent application Ser. No. 12/544,365, filed on Aug. 20, 2009, now U.S. Pat. No. 8,629,554, which was a Divisional application of U.S. patent application Ser. No. 11/933,107, filed on Oct. 31, 2007, now U.S. Pat. No. 8,106,505.

BACKGROUND OF THE INVENTION

Field of the Invention

The present invention generally relates to an assembly including plural through wafer vias and more particularly, an assembly including through wafer vias that electrically connect an integrated circuit of a chip and an integrated circuit of a casing having upper and lower portions formed on a side of the chip.

Description of the Related Art

Commercially available cold plates for single and multi-chip applications are designed for uniform heat removal. However, the power dissipation of an IC-chip is strongly non-uniform. A cold plate designed for uniform heat flux with the maximal power density as design point is not economical, since its heat removal capability at cache locations is exceeding the needs and results in waste of pumping power and loss of energy. These problems get accentuated in 3D stacked chips since the space for fluid manifolding and for heat removal is constrained.

A related art method for providing heat dissipation in 3D stacked chips intersperses specialized cooling structures at periodic points within the monolithic structure of the chip stack. In this related art method, a special pair of chips is interspersed. One chip has had a trench etched into it, and the other acts as a cap. When the chips are put together and interspersed between active chips, the chips form cooling channels.

C-4 bumps provide electrical connection to the individual chips on one face of the structure, while the cooling channels are exposed on a second face. A fluid manifold is attached to the second face to provide coolant flow. The trenches may be etched in the cooling channels. More than one face may be used for electrical connection to the chip stack.

In another embodiment of this related art method, metal cooling plates of Aluminum, Copper, Molybdenum, etc. are interspersed between active chips. The C-4 bumps provide electrical connection to the individual chips on one side of the face of the structure, while the cooling plates are connected to a heat sink on a second face. More than one face may contain electrical connection to the chip stack.

However, in this related art method, the cap chip and trench chips are not active chips. Thus, this related art method is an inefficient use of space on the system board.

SUMMARY OF THE INVENTION

In view of the foregoing and other exemplary problems, drawbacks, and disadvantages of the conventional methods and structures, an object of the present invention is to provide an assembly that may result in a more efficient use of space on the system board than in conventional structures.

An exemplary aspect of the present invention is directed to an assembly which includes a chip including an integrated circuit, a casing including an integrated circuit and having an upper portion formed on a side of the chip and lower portion formed on another side of the chip, plural through-wafer vias (TWVs) for electrically connecting the integrated circuit of the chip and the integrated circuit of the casing, and a card connected to the casing for electrically connecting the casing to a system board.

Another exemplary aspect of the present invention is directed to a method of cooling a chip stack in an assembly. The method includes transporting a coolant fluid to the chip stack through an inlet formed in a casing, the casing including an integrated circuit which is electrically connected to an integrated circuit of a chip in the chip stack by plural through wafer vias, transporting the coolant fluid in a fluid channel formed between chips in the chip stack, and transporting the coolant fluid from the chip stack through an outlet formed in a casing.

Another exemplary aspect of the present invention is directed to a method of forming an assembly. The method includes providing a chip including an integrated circuit, forming a casing including an integrated circuit, an upper portion of the casing being formed on a side of the chip and a lower portion of the casing being formed on another side of the chip, forming plural through-wafer vias (TWVs) for electrically connecting the integrated circuit of the chip and the integrated circuit of the casing, and connecting a card to the casing for electrically connecting the casing to a system board.

With its unique and novel features, the exemplary aspects of the present invention may provide an assembly which may result in a more efficient use of space on the system board than in conventional structures.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1A:
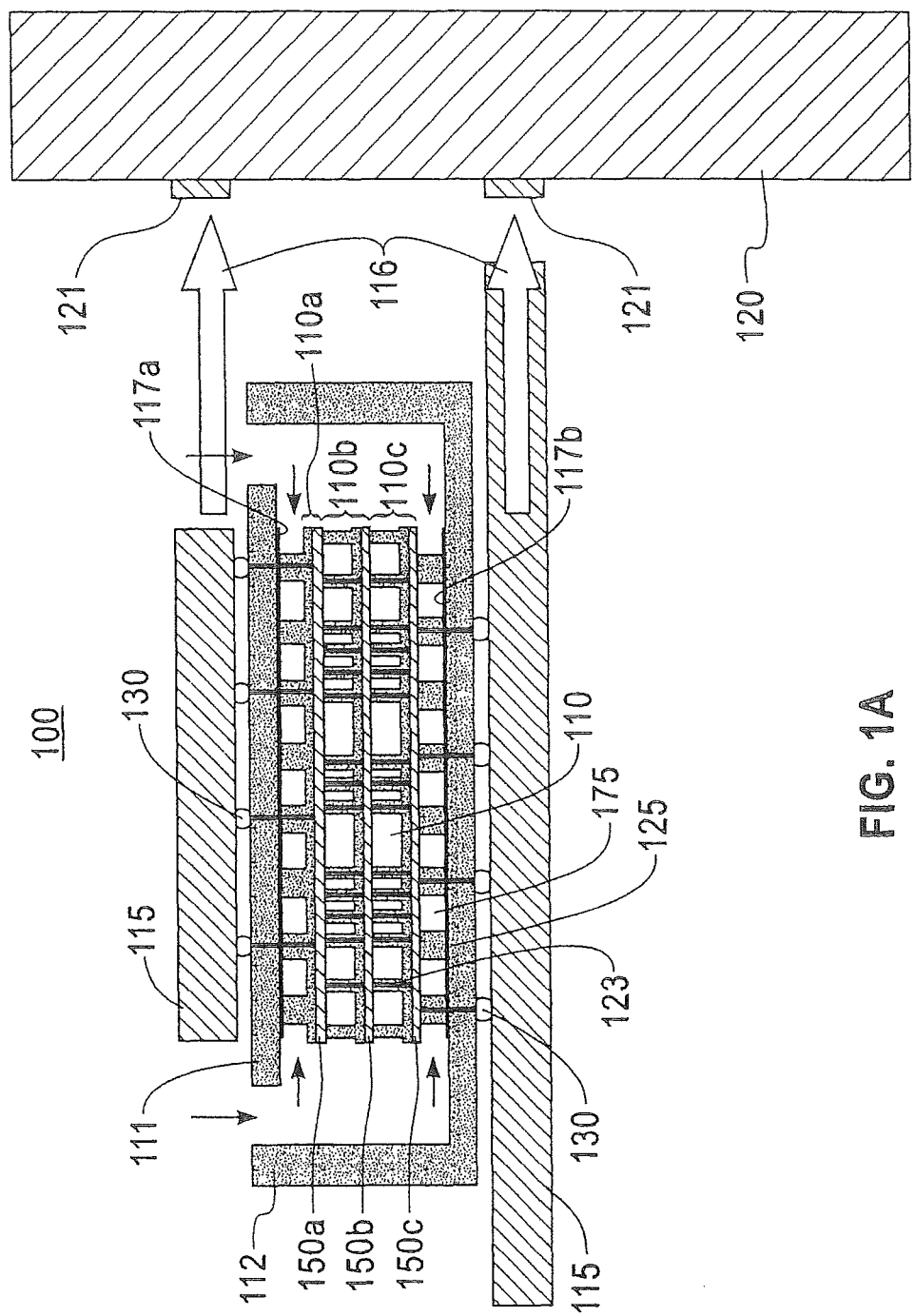
FIG. 1a illustrates an input/output assembly 100 according to an exemplary aspect of the present invention.
Figure 1B:
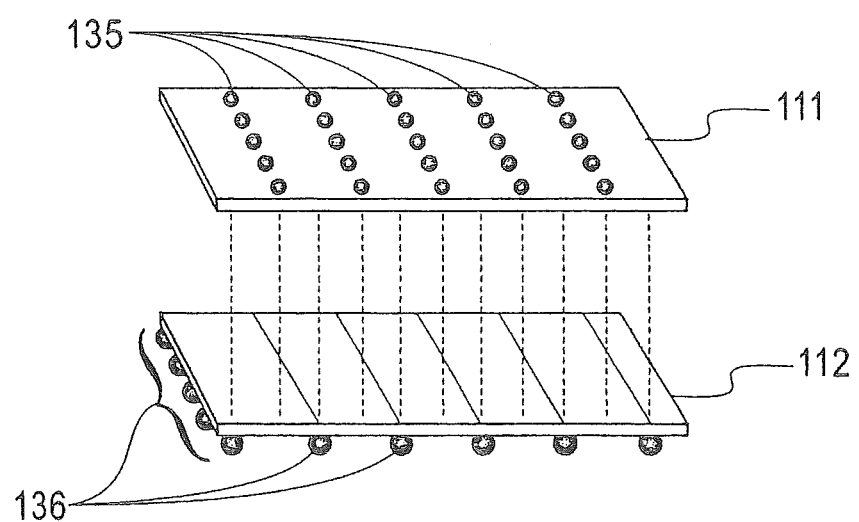
FIG. 1b illustrates rows 135 of solder balls on the upper casing 111 alternately formed with the rows 136 of solder balls on the lower casing 112, according to an exemplary aspect of the present invention.

Referring now to the drawings, and more particularly to FIGS. 1a-12C, there are shown exemplary embodiments of the method and structures of the present invention.

Overview

Conventional cold plates cannot optimally remove heat from chips (e.g., processor chips) since they are attached via a thick chip, a thermal interface, and a cooler bottom plate. All these components spread the heat from hotspots laterally and the heat is transferred to the liquid using a uniform heat transfer coefficient. This approach is not optimal in terms of pumping energy efficiency and entropy. In the constrained space between two active chips, these problems are accentuated and need to be solved to reach acceptable performances. The geometrical constraint combined with the high density of area array vertical interconnects cause a high fluid resistance. The result is a low mass flow rate of coolant for a given pressure drop from inlet to outlet. For example, a uniform heat transfer with a 150 micron gap and a 200 micron interconnect pitch allows only the removal of ~70 W/cm$^2$.

The present invention, on the other hand, provides a structure that may individually and in combination result in an improved cold plate efficiency. First, the invention may redistribute hot spots to thermodynamically efficient locations (e.g. at fluid inlets), where the fluid temperature is still low. Second, the invention may remove or change the density distribution of interconnects to reduce the fluid resistance to the hot spot providing sufficient interconnects for local and global needs. Third, the invention may manifold the fluid with guiding structures to the hot spot for an increase in local flow rate also including delivery and drainage of coolant from plural (e.g., four) sides. This multi-port (e.g., four-port) cold plate architecture results in shorter fluid paths for handling of hotspots.

In addition, fluid flow may be directed such that for a given power map a uniform junction temperature of $T_{max}$ and a minimal pumping power is reached. The increased fluid outlet temperature can eliminate the secondary cooling loop by direct exchange of the heat to the ambient. The heat transfer geometry is structured into silicon to form fins that match the through silicon via-holes. The selected packaging approach reduces stress from thermal expansion mismatch and allows two sided heat removal for all dies.

The combination of all the above mentioned features results in a multi-port locally adapted heat removal geometry for an optimal amount of electrical interconnects. The geometry may be designed for a hot spot optimized power map resulting in a uniform junction temperature. Unlike conventional structures in which power density limits force the circuit designer to spread the hot spots over the chip surface, in the claimed invention, it may be energetically beneficial to cool optimal located hot spots. This typically allows removal of 2× larger overall power from a chip and up to 4× higher hotspot power densities than a uniform cooling approach.

Detailed Discussion

In certain applications of 3D Integration technology, a highest possible bandwidth as well as a minimum signal latency is important for sustaining high-throughput. The problem is that this bandwidth and latency advantage is squandered if it is not propagated out onto the system board. The scaling of conventional chip packaging technology has not kept up with chip-level integration interconnect density.

The present invention allows the chip packaging to more closely match the chip integration interconnect density.

It is projected that thru-wafer vias (TWVs) (e.g., 3D-Integrated TWVs) in chip stacks may potentially become smaller than 1 micron in diameter. Packaging technology interconnections such as C-4 presently has become limited to 3 millimeter diameter balls on 6 millimeter centers, which is 3 decades larger that the 3D Integrated pitch.

The present invention includes an improved packaging technology that uses TWVs which run through a chip stack and contact adjoining C-4 solder joints on one side or the other of the stack. For example, in one exemplary aspect, the TWVs run completely through a chip stack and contact adjoining C-4 solder joints alternately on one side or the other of the stack, thus interleaving I/O above and below the stack.

The challenge then is that the heatsink, which in conventional structures is typically mounted on one side or the other of the stack to keep the part within reliability temperature limits, is now displaced by signal I/O, and a new cooling method must be substituted.

In the present invention, the conventional heatsink may be replaced by using a cooling fluid at areas of high power dissipation density. In an exemplary aspect of the present invention, microfluidic or gas cooling channels may be etched within the chip stack, to help transport the cooling fluid to areas of high power dissipation density.

FIG. 1a illustrates an input/output assembly 100 according to an exemplary aspect of the present invention. As illustrated FIG. 1a, the assembly 100 may include a chip stack 110.

The chips 110a-110c in the chip stack 110 may have integrated circuits 150a-150c including active elements (e.g., transistors, diodes, resistors, etc.) formed thereon, respectively. For example, the integrated circuits 150a-150c may include microprocessor circuits including plural logic elements. The chips (e.g., layers) of the chip stack 110 may be interconnected by using TWVs 123. That is, the TWVs 123 may electrically interconnect the active elements on the chips in the stack 110.

The chips in the stack 110 may include, for example, a microprocessor element formed thereon. It should be noted that although FIG. 1a illustrates a chip stack 110 including three chips, the chip stack 110 may include one or more chips.

The assembly 100 may also include circuitboards 115 which include wiring 116 (e.g., "circuitboard wiring") for porting the signals to a system board 120, via connectors 121 formed on the system board 120. The chip stack 110 may be connected to upper casing 111 and lower casing 112 by plural vertical vias 125. Importantly, the upper casing 111 and lower casing 112 may include integrated circuits 117a, 117b which are electrically connected to the integrated circuits 150a-150c in the chip stack by the TWVs 123.

Plural C-4 solder balls 130 may be used to bond and electrically connect the casings 111, 112 to the daughercards 115. The C-4 solder balls 130 may be formed in an array of rows and columns on both the upper and lower casings 111, 112. Further, the rows and/or columns of solder balls 130 may be alternately formed on the upper and lower casings 111, 112 so that I/O is interleaved above and below the stack. For example, FIG. 1a illustrates an example of where a row of solder balls 130 on the upper casing 111 is interleaved with a corresponding row of solder balls 130 on the lower casing 112, so that the larger solder balls may fit in the tighter pitch of the through-silicon vias.

It should also be noted that entire rows and/or columns of solder balls 130 in the solder ball arrays on the upper and lower casings 111, 112 may be alternately formed. For example, as illustrated in the plan view of FIG. 1b, the rows 135 of solder balls on the upper casing 111 are alternately formed with the rows 136 of solder balls on the lower casing 112.

It is important to point out that like the chips in the stack 110, the upper and lower casings 111, 112 may include active elements (e.g., transistors, diodes, resistors, etc.) formed thereon. That is, the vertical vias 125 may be used to electrically connect the active elements formed on the upper and lower casings 111, 112 to stack 110 and the Circuit boards 115. Thus, the 3D integrated circuit of the present invention may include not only the active elements on the chips of the chip stack 110, but also the active elements on the casings 111, 112. This may allow the present invention to achieve a more efficient use of space than in conventional structures.

Coming out of the chip stack 110, the plural vertical vias 125 (e.g., many thousands of vertical vias, ostensibly having a diameter of 1 micron or less), should go through the C-4 solder ball 130 (e.g., a 75 micron diameter C-4 solder ball) in order to contact the circuit board 115. In high bandwidth situations, it may impossible to get all of the vertical vias 125 out of one side. However, in this exemplary aspect of the present invention, C-4 solder balls 130 may be formed on both the upper and lower sides of the chip stack 110. In addition, these solder balls 130 may alternately contact adjacent vertical vias 125, which may cut at least in half the demand on either side for space in which to place a C-4 solder ball 130, relieving a bandwidth bottleneck without adding latency arising from impedance of longer wires.

In particular, when the chip stack 110 includes high performance logic instead of simply memory upon logic, it is essential to cool the chip stack 110 between the individual layers of the chip stack 110 during operation. Since there is no place for the heatsink in this design, this exemplary aspect of the present invention provides another mechanism for dissipating heat.

In this exemplary aspect of the present invention, the chip stack 110 may be efficiently cooled by etching channels 175 into the silicon of each layer of the chip stack 110. These channels 175 may conduct coolant fluids or gases throughout the chip between any two layers of the chip stack 110 to provide the necessary cooling.

The arrows in FIG. 1a represent an exemplary flow of coolant in the assembly 100. In addition to the flow indicated by the arrows, as noted above, the fluid may also flow between the layers of the chip stack 110 and around the TWVs 123.

The cooling channels 175 may require a film thickness (e.g., a silicon film thickness) of at least 50 microns. However, assuming a 10:1 maximum aspect ratio for vertical vias, the vias may be as small as 5 microns in diameter, still at least a decade smaller than the C-4 solder balls 130 needed to connect the vertical vias to the system board 120. Again in high density vertical via environments, it is still essential to relieve this bottleneck to bandwidth.

As noted above, an important aspect of the present invention is the two sided interleaving of C-4 solder balls 130 to the chip stack 110.

The present invention may also include connecting the two sides of the stack 110 to the circuit boards 115, and connecting the cooling channels to the coolant fluid source.

Figure 2:
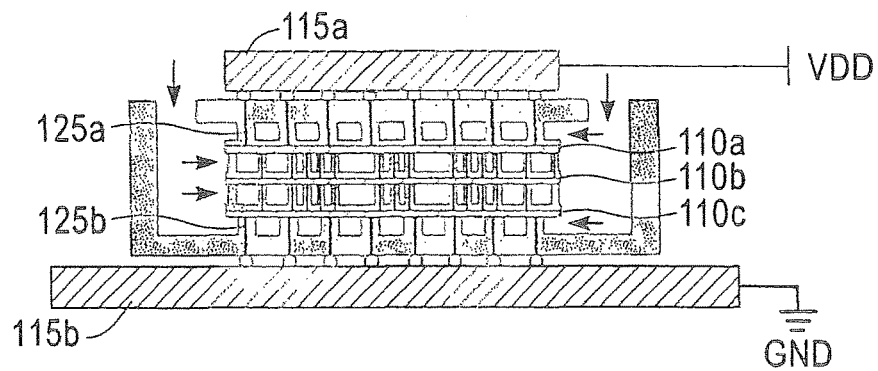
FIG. 2 illustrates an assembly which may be used for chip identification personalization, according to an exemplary aspect of the present invention.
Figure 3:
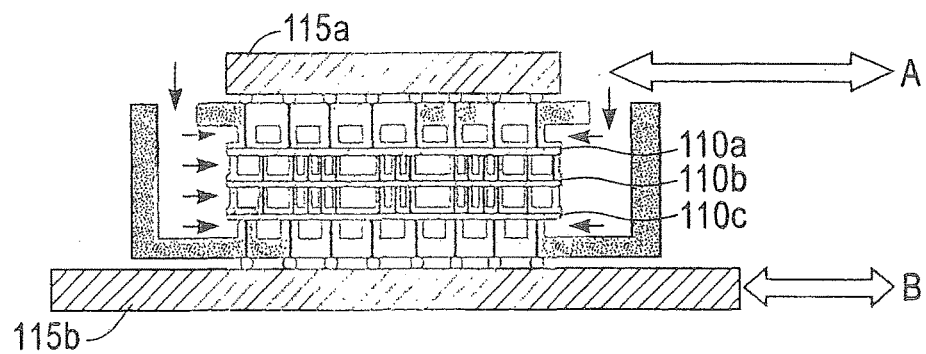
FIG. 3 illustrates an assembly which may be used for multiple signal use of the same Z coordinate, according to an exemplary aspect of the present invention.
Figure 4:
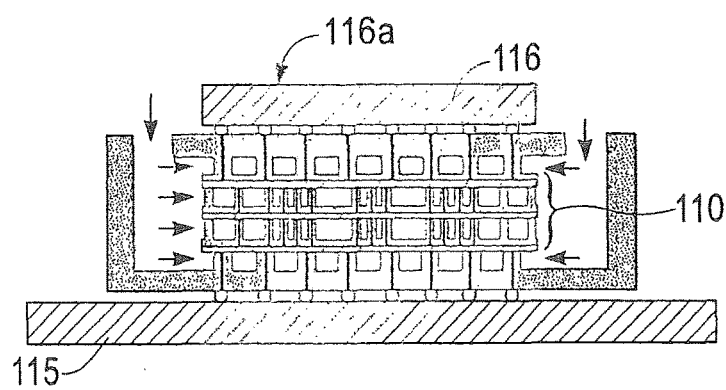
FIG. 4 illustrates an assembly that may be used for a sensor application and/or emitter application, according to an exemplary aspect of the present invention.

As illustrated in the exemplary aspect of FIG. 1a, a two-sided packaging interconnect to a chip stack may be used to achieve a more efficient use of space on the system board 120. FIGS. 2-4 illustrate other exemplary aspects of the present invention. Many of the features of the aspects of FIGS. 2-4 are similar to those in FIG. 1a, and thus, the description above with respect to FIG. 1a is applicable with respect to FIGS. 2-4 and will not be repeated.

For example, FIG. 2 illustrates another exemplary aspect of the present invention which may be used for chip identification personalization. In this exemplary aspect, the stack 110 may include identical chips (e.g., chips having the same configuration of active elements). In this case, the vertical vias 123 may establish chip addresses.

On one side of the stack 110 may be connected to VDD, on the other side of the stack 110 may be connected to GND. In this case, a vertical via no longer needs to penetrate the whole stack 110, but instead may only contact a portion on the chips in the stack 110 at that Z coordinate from one side of the stack 110. The other vias may be contacted with the opposite polarity from the same Z coordinate, but on the other side of the stack 110. The vertical via etch masks are the only layers that are personalized, but may be applied to identical processor chips.

For example, as illustrated in FIG. 2, circuit board 115a is connected to VDD and circuit board 115b is connected to GND. Further, chips 110a-110c are identical, and via 125a is electrically connected to chips 110a and 110b, but not to chip 110c in the stack 110, whereas via 125b is electrically connected to chips 110b and 110c, but not to chip 110a in the stack 110.

FIG. 3 illustrates another exemplary aspect of the present invention which may be used for multiple signal use of the same Z coordinate. In this exemplary aspect, the stack 110 may include heterogeneous chips (e.g., chips that are not identical). In this case, pads at a given Z coordinate in the chip stack 110 may be used on different busses and/or for different signals and uses. That is, the two-sided technique of the present invention provides for a means of using the same Z coordinate for more than one signal or clock, power, or ground connection.

For example, as illustrated in FIG. 3, chips 110a-110c are not identical, and circuit board 115a is electrically connected to signal bus A, whereas circuit board 115b is electrically connected to signal bus B.

FIG. 4 illustrates another exemplary aspect of the present invention which is directed to a sensor application and/or emitter application. For example, a sensor such as an imaging sensor or RF-antenna which is exposed to the environment may be connected to a 3D chip stack. However, in this case, there would be no space for a conventional heat sink to attach to the chip stack. In the present invention, on the other hand, interlayer cooling enables the use one side of the package for true area array I/O and still allows the exposure of the sensor to the environment.

For example, as illustrated in FIG. 4, card 116 may include a surface 116a which is exposed to an environment such as the ambient environment. On the surface 116a, a photosensor (e.g., a photodiode) may be formed for sensing or detecting light, or a light emitting element may be formed for emitting light. Similarly, on the surface 116a, an RF-antenna may be formed for receiving or detecting an RF signal, or an RF emitter may be formed for emitting an RF signal. In this case, the circuit board 115 may be connected for example, to a system board to allow an I/O function for the stack 110.

Figure 5:
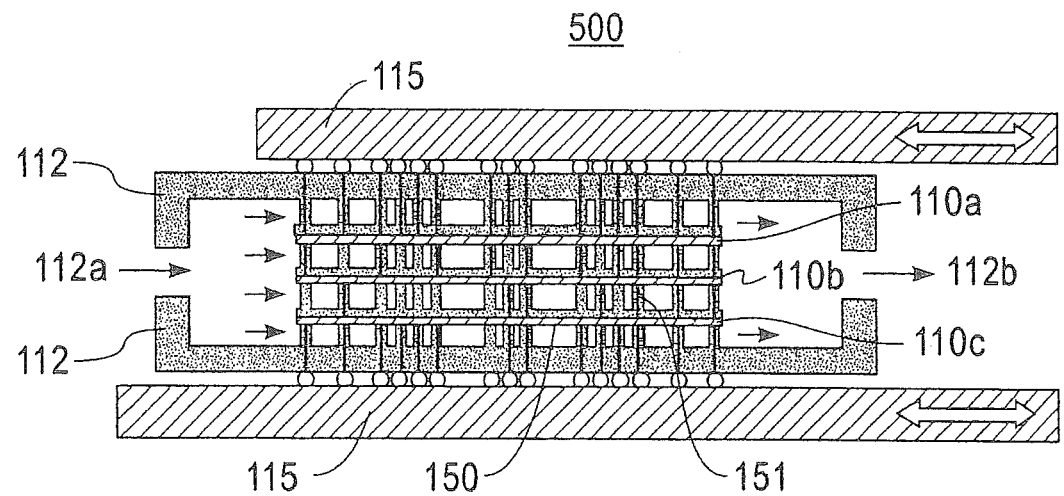
FIG. 5 illustrates another assembly, according to an exemplary aspect of the present invention.

FIG. 5 illustrates another possible implementation, according to an exemplary aspect of the present invention. Specifically, FIG. 5 illustrates an assembly 500 which includes three chips 110a-110c having an integrated circuit 150 formed thereon. The through-wafer vias (TWVs) 123 may be formed in heat transfer structures (e.g., pillars) which are etched into the silicon die 151 and form a fluid channel. The chips 110a-110b may be embedded into a casing 112 (e.g., silicon casing).

The casing 112 includes a coolant inlet 112a and a coolant outlet 112b, through which a coolant fluid may be transported for cooling the stack 500. The casing 112 is bonded to circuit boards 115. That is, the chips 110a-110c may include a double sided C-4 I/O to circuit boards 115. The electrical area array interconnects are realized with through the wafer vias 123.

Figure 6:
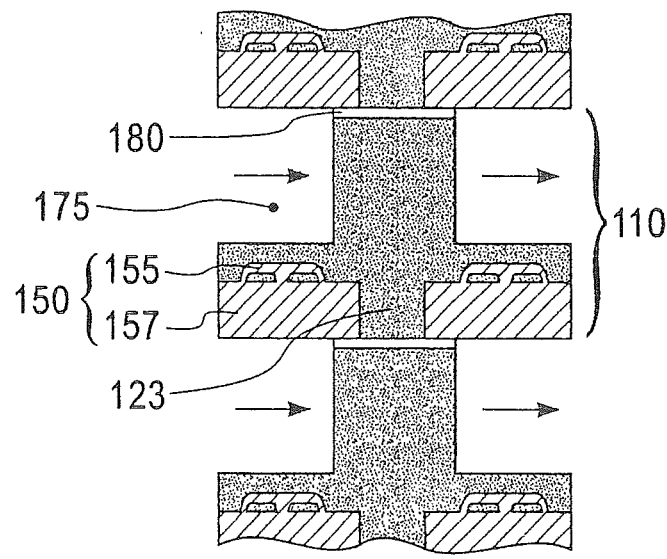
FIG. 6 illustrates a cross-section of a through-wafer via 123, according to an exemplary aspect of the present invention.

FIG. 6 illustrates a cross-section of a through-wafer via 123, according to an exemplary aspect of the present invention. As illustrated in FIG. 6, the chip 110 may include the integrated circuit 150 which includes transistor 155 and various wiring levels 157, and the silicon die 151 formed on the integrated circuit 150. Further, a fluid channel 175 may be formed between the chips in the chip stack 110 and between the chip stack 110 and the casing 112. The fluid channel 175 may be formed between the planar surface of the silicon die 151 and the have a height which is less than about 50 microns.

As illustrated, in FIGS. 5 and 6, the heat transfer geometry according to the present invention may be structured into the silicon die 151 in the form of pins and fins (e.g., the pillars of silicon in which the vias 123 are formed). The silicon die 151 of a chip in the stack 110 may be bonded to a next upper layer with a solder layer 180.

For example, to bond the silicon die 151 of a chip to a next upper layer, an "island" of an electrically conductive solder material (e.g., a metal solder material) may be formed on the via 123 in a "pin" of the silicon die 151. The island of solder material may then be surrounded by a ring structure (e.g., electrically insulative material) which seals the electrical interconnect from the fluid in the fluid channels. The chip is then aligned with pressed to the next upper layer. Importantly, both bonding areas conduct heat to the fins (e.g., both the solder layer 180 formed above and the solder layer 180 formed below a chip may conduct heat away from the chip). The chip stack is then packaged into a silicon casing including the manifold and the electrical I/O's with the possibility of ball grid array bonding on both sides of the package.

Figure 7:
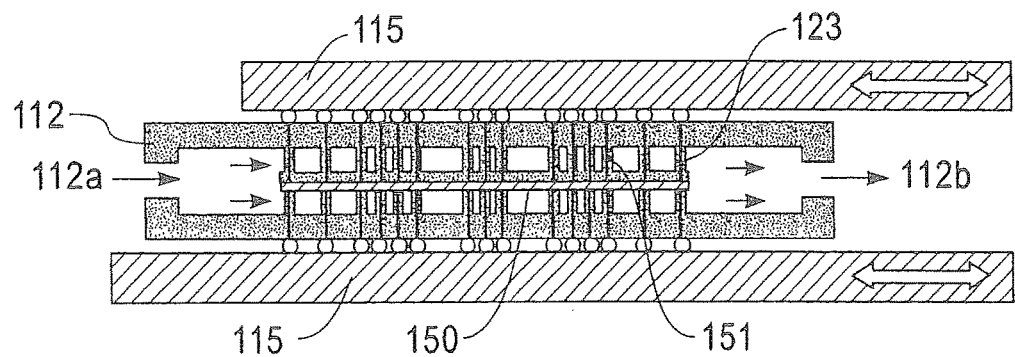
FIG. 7 illustrates an assembly 700 according to another exemplary aspect of the present invention.

FIG. 7 illustrates an assembly 700 according to another exemplary aspect of the present invention. The assembly 700 is similar to assembly 500 and includes through-wafer vias (TWVs) 123 formed in heat transfer structures (e.g., pillars) etched into the silicon die. However, as illustrated in FIG. 7, the assembly 700 may include only one single active IC layer 150 embedded into a silicon casing 112. This allows double sided C-4 I/O to the circuit board 115. That is, the "chip stack" (e.g., as illustrated, for example, in FIG. 5) can be reduced to a single chip with double sided I/O.

Figure 8:
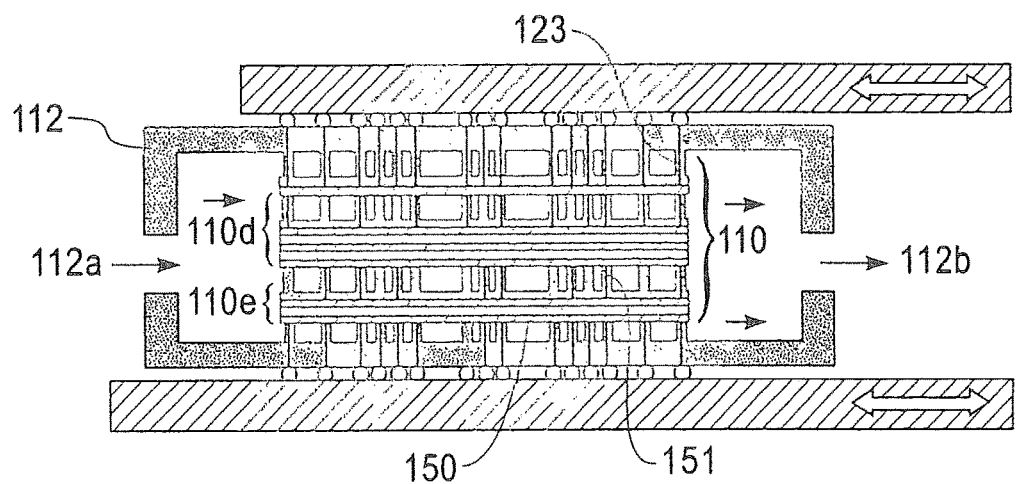
FIG. 8 illustrates an assembly 800 according to another exemplary aspect of the present invention.

FIG. 8 illustrates an assembly 800 according to another exemplary aspect of the present invention. The assembly 800 is similar to assembly 500 and includes through a stack 110, wafer vias (TWVs) 123 formed in heat transfer structures (e.g., pillars) etched into the silicon die 151, and a casing 112 which allows double side C-4 I/O to circuit boards 115. However, in the assembly 800, the chip stack 110 may include a multi-active IC layer 110d, 110e which include plural layers of integrated circuits which may be connected via TWVs. That is, an active layer (e.g., an integrated circuit layer on an individual chip in the stack 110 in FIG. 1a) can be replaced by multiple active layers as shown in FIG. 8. In this case, the uppermost layer of the multiple layers may be etched to form the heat transfer structures (e.g., pillars) of the silicon die, to provide for a coolant channel above the multiple layers.

Figure 9:
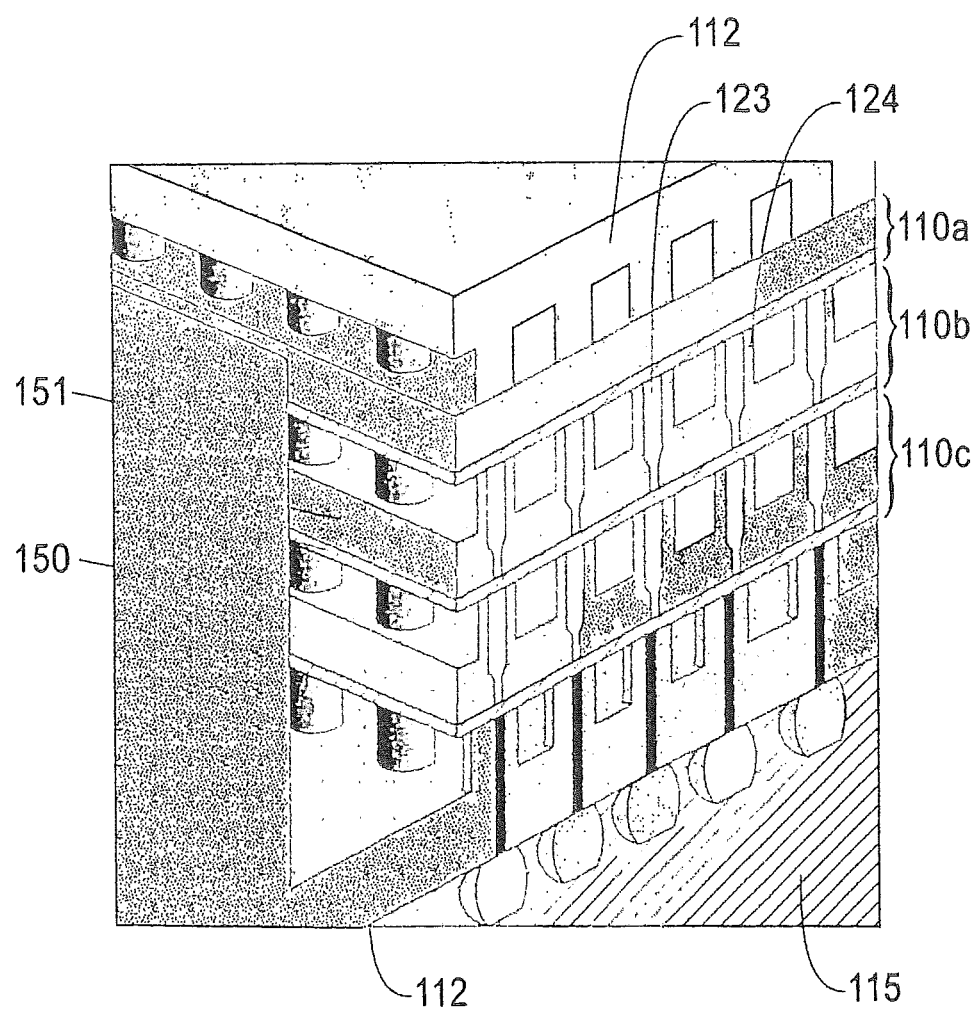
FIG. 9 provides an isometric view of a cross-section of an assembly 900 according to an exemplary aspect of the present invention.

FIG. 9 provides an isometric view of a cross-section of an assembly 900 according to an exemplary aspect of the present invention. The assembly 900 includes a stack 110 having chips 110a-110c which may include an integrated circuit 150 and a silicon die 151. Further, the through-wafer vias (TWVs) 123 are formed in heat transfer structures 124 (e.g., pillars of silicon) etched into the silicon die 151, and a casing 112 which allows double side C-4 I/O to circuit cards 115.

Figure 10:
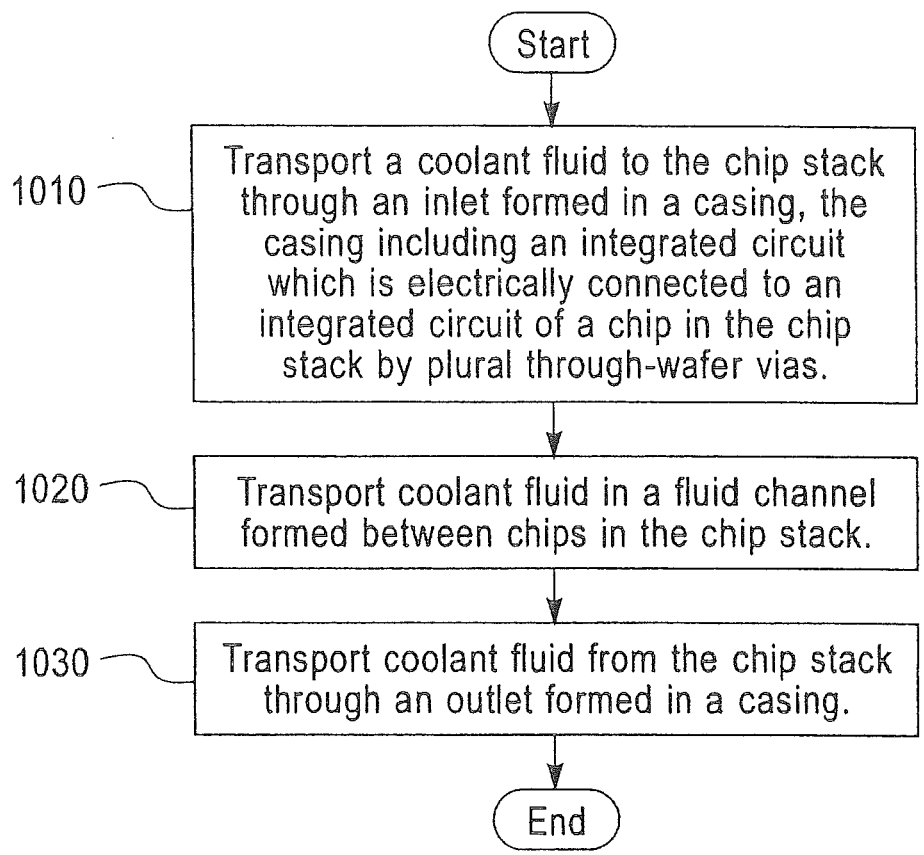
FIG. 10 illustrates a method 1000 of cooling a chip stack in an assembly, according to an exemplary aspect of the present invention.

FIG. 10 illustrates a method 1000 of cooling a chip stack in an assembly (e.g., the assembly as illustrated in FIG. 1a), according to an exemplary aspect of the present invention. The method 1000 includes transporting (1010) a coolant fluid to the chip stack through an inlet formed in a casing, the casing including an integrated circuit which is electrically connected to an integrated circuit of a chip in the chip stack by plural through wafer vias, transporting (1020) coolant fluid in a fluid channel formed between chips in the chip stack, and transporting (1030) coolant fluid from the chip stack through an outlet formed in a casing.

Figure 11:
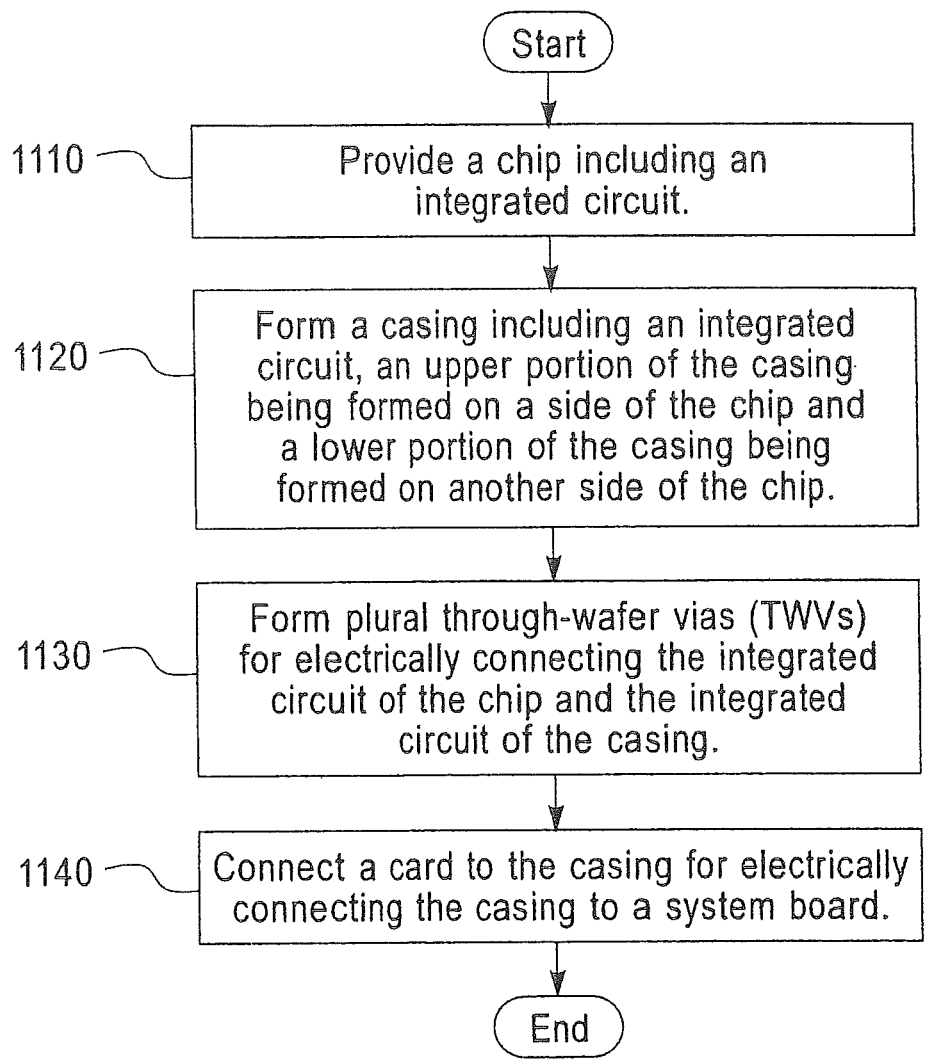
FIG. 11 illustrates a method 1100 of fabricating an assembly, according to an exemplary aspect of the present invention.

FIG. 11 illustrates a method 1100 of fabricating an assembly (e.g., the assembly as illustrated in FIG. 1a), according to an exemplary aspect of the present invention. The method 1100 providing (1110) a chip including an integrated circuit, forming a casing including an integrated circuit, an upper portion of the casing being formed on a side of the chip and a lower portion of the casing being formed on another side of the chip, forming plural through-wafer vias (TWVs) for electrically connecting the integrated circuit of the chip and the integrated circuit of the casing, and connecting a card to the casing for electrically connecting the casing to a system board.

Figure 12A:
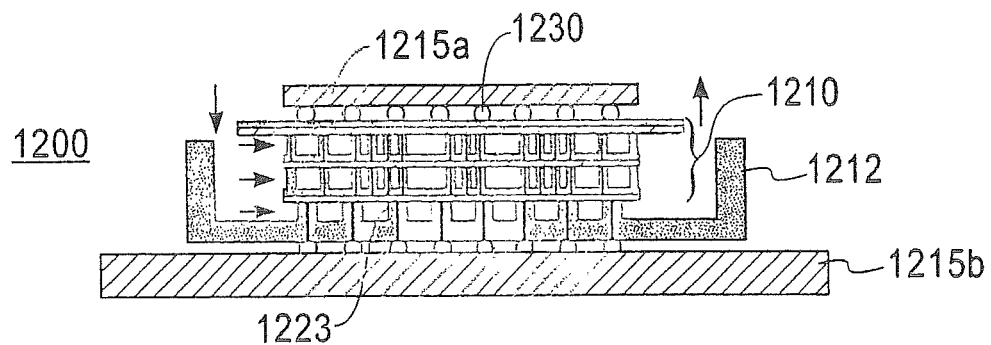
FIGS. 12A-12C illustrate assemblies 1200, 1300 and 1400, respectively, according to other exemplary aspects of the present invention.
Figure 12B:
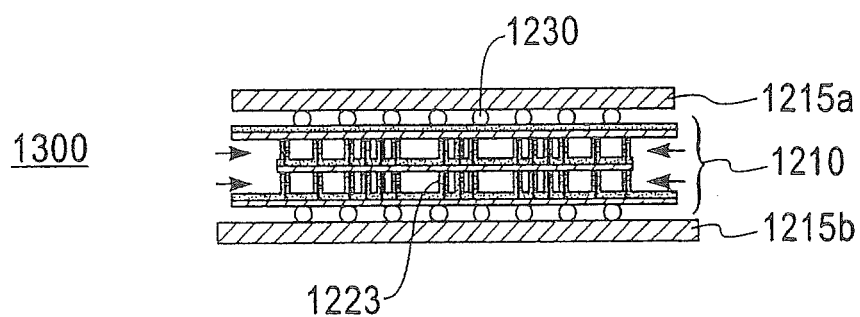
Figure 12C:
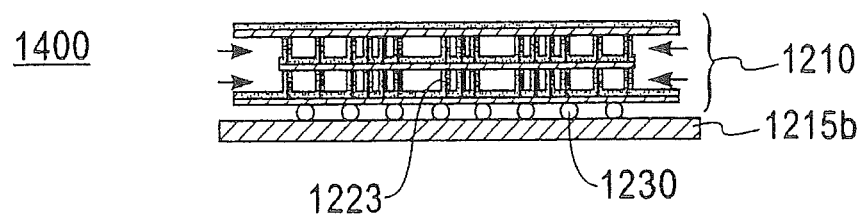

FIGS. 12A-12C illustrate assemblies 1200, 1300 and 1400, respectively, according to other exemplary aspects of the present invention. Similarly to the other exemplary aspects of the present invention, the assemblies 1200, 1300 and 1400 may include a chip stack 1210, a daughtercard 1215a and/or daughtercard 1215b, lower casing 1212 TWVs 1223 and solder balls 130.

In summary, the present invention may locally adapt the heat transfer rate of a cold plate according to the power map with the goal to optimize the overall heat removal rate for a given pumping power for a low gap 3D-IC stack with electrical interconnects. The present invention may alleviate problems with heat removal from hotspots and improve cold plate efficiency in terms of pumping power and removal of a maximum amount of energy with the least fluid volume. The present invention may work for all types of cold plates but are especially efficient where only little vertical space is available like in interlayer cooling for 3D packaged processors. In particular, the present invention may provide for a hot spot focused heat transfer architecture, a uniform junction temperature, and a multi-port (e.g., four port) fluid delivery architecture to increase mass flow in constrained gaps.

With its unique and novel features, the exemplary aspects of the present invention may provide an assembly which may result in a more efficient use of space on the system board than in conventional structures.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim in the present application should be construed as a disclaimer of any interest in or right to an equivalent of any element or feature of the amended claim.

What is claimed is:

1. An assembly, comprising:
    a chip including an integrated circuit;
    a casing including an integrated circuit and including:
        an upper portion formed on a side of said chip;
        a lower portion formed on another side of said chip; and
        a cooling inlet and a cooling outlet for transferring a coolant, provided in an upper surface of the casing, and forming outer sidewalls of said upper portion and inner sidewalls of said lower portion;
    a system board configured to be electrically connected to the casing;
    plural through-wafer vias (TWVs) for electrically connecting said integrated circuit of said chip and said integrated circuit of said casing; and
    a plurality of cards connected to said casing for electrically connecting said casing to said system board,
    wherein said card comprises an upper card connecting said upper portion of said casing to said system board, and a lower card connecting said lower portion of said casing to said system board,
    wherein said upper card comprises one of a photosensor, light emitting element, radio frequency (RF) antenna, and radio frequency emitter,
    wherein said lower card comprises an area array input/output, and
    wherein, in a cross-sectional view, opposing edges of said upper card are located between vertical planes defined by said outer sidewalls of said upper portion of said casing, said outer sidewalls of said upper portion of said casing are located between vertical planes defined by opposing outer sidewalls of said lower portion of said casing, said opposing outer sidewalls of said lower portion of said casing are located between vertical planes defined by opposing edges of the lower card, and an edge of the opposing edges of the upper card faces and is spaced apart from a surface of said system board.

2. The assembly of claim 1, wherein said upper and lower cards are connected to said upper and lower portions of said casing, respectively, by plural solder balls which are aligned with said plural through-wafer vias such that said plural through-wafer vias are electrically connected to said upper and lower cards.

3. The assembly of claim 2, wherein said chip further comprises a silicon die formed on said integrated circuit of said chip, said plural through-wafer vias being formed in silicon pillars of said silicon die.

4. The assembly of claim 3, wherein said chip comprises plural chips which form a chip stack.

5. The assembly of claim 4, further comprising:
    a fluid channel formed between an upper surface of a silicon die formed on a first chip in said chip stack, and a lower surface of a second chip formed above said first chip in said chip stack.

6. The assembly of claim 5, wherein said upper and lower portions of said casing form the coolant inlet for transporting said coolant into said chip stack, and the coolant outlet for transporting said coolant out of said chip stack.

7. The assembly of claim 1, wherein said through-wafer vias comprise first vias that run through said chip and electrically connect said integrated circuit of said chip to said upper casing, and second vias that run through said chip and electrically connect said integrated circuit of said chip to said lower casing.

8. The assembly of claim 7, wherein said first and second vias being alternately formed such that an interleaving input/output (I/O) is formed above and below said chip.

9. The assembly of claim 1, wherein said integrated circuit on said chip comprises a microprocessor circuit.

10. The assembly of claim 4, wherein said integrated circuits of said plural chips and said integrated circuit of said casing collectively form a three dimensional integrated circuit.

11. The assembly of claim 4, wherein said plural chips in said chip stack comprise different integrated circuits.

12. An assembly, comprising:
    a chip including an integrated circuit;
    a casing including an integrated circuit and including:
        an upper portion formed on a side of said chip;
        a lower portion formed on another side of said chip; and
        a cooling inlet and a cooling outlet for transferring a coolant, provided in an upper surface of the casing, and forming outer sidewalls of said upper portion and inner sidewalls of said lower portion;
    a system board configured to be electrically connected to the casing;
    plural through-wafer vias (TWVs) for electrically connecting said integrated circuit of said chip and said integrated circuit of said casing; and
    a plurality of cards connected to said casing for electrically connecting said casing to said system board,
    wherein said card comprises an upper card connecting said upper portion of said casing to said system board, and a lower card connecting said lower portion of said casing to said system board,
    wherein said upper and lower cards are connected to said upper and lower portions of said casing, respectively, by plural solder balls which are aligned with said plural through-wafer vias such that said plural through-wafer vias are electrically connected to said upper and lower cards,
    wherein said chip further comprises a silicon die formed on said integrated circuit of said chip, said plural through-wafer vias being formed in silicon pillars of said silicon die,
    wherein said chip comprises plural chips which form a chip stack,
    wherein said plural chips in said chip stack comprise identical integrated circuits, and said upper card is connected to VDD and said lower card is connected to GND, wherein, in a cross-sectional view, opposing edges of said upper card are located between vertical planes defined by said outer sidewalls of said upper portion of said casing, said outer sidewalls of said upper portion of said casing are located between vertical planes defined by opposing outer sidewalls of said lower portion of said casing, said opposing outer sidewalls of said lower portion of said casing are located between vertical planes defined by opposing edges of the lower card, and an edge of the opposing edges of the upper card faces and is spaced apart from a surface of said system board.

13. The assembly of claim 12, further comprising:
a fluid channel formed between an upper surface of a silicon die formed on a first chip in said chip stack, and a lower surface of a second chip formed above said first chip in said chip stack.

14. The assembly of claim 13, wherein said upper and lower portions of said casing form the coolant inlet for transporting said coolant into said chip stack, and the coolant outlet for transporting said coolant out of said chip stack.

15. The assembly of claim 14, wherein said through-wafer vias comprise first vias that run through said chip and electrically connect said integrated circuit of said chip to said upper casing, and second vias that run through said chip and electrically connect said integrated circuit of said chip to said lower casing.

16. The assembly of claim 15, wherein said first and second vias being alternately formed such that an interleaving input/output (I/O) is formed above and below said chip.

17. The assembly of claim 12, wherein said integrated circuit on said chip comprises a microprocessor circuit.

18. An assembly, comprising:
a chip including an integrated circuit;
a casing including an integrated circuit and including:
an upper portion formed on a side of said chip;
a lower portion formed on another side of said chip; and
a cooling inlet and a cooling outlet for transferring a coolant, provided in an upper surface of the casing, and forming outer sidewalls of said upper portion and inner sidewalls of said lower portion;
a system board configured to be electrically connected to the casing;
plural through-wafer vias (TWVs) for electrically connecting said integrated circuit of said chip and said integrated circuit of said casing; and
a plurality of cards connected to said casing for electrically connecting said casing to said system board,
wherein said card comprises an upper card connecting said upper portion of said casing to said system board, and a lower card connecting said lower portion of said casing to said system board,
wherein said upper and lower cards are connected to said upper and lower portions of said casing, respectively, by plural solder balls which are aligned with said plural through-wafer vias such that said plural through-wafer vias are electrically connected to said upper and lower cards,
wherein said chip further comprises a silicon die formed on said integrated circuit of said chip, said plural through-wafer vias being formed in silicon pillars of said silicon die,
wherein said chip comprises plural chips which form a chip stack,
wherein said plural chips in said chip stack comprise different integrated circuits,
wherein said upper card is connected to a first signal bus, and said lower card is connected to second signal bus that is different from said first signal bus, and
wherein, in a cross-sectional view, opposing edges of said upper card are located between vertical planes defined by said outer sidewalls of said upper portion of said casing, said outer sidewalls of said upper portion of said casing are located between vertical planes defined by opposing outer sidewalls of said lower portion of said casing, said opposing outer sidewalls of said lower portion of said casing are located between vertical planes defined by opposing edges of the lower card, and an edge of the opposing edges of the upper card faces and is spaced apart from a surface of said system board.

19. The assembly of claim 18, further comprising:
a fluid channel formed between an upper surface of a silicon die formed on a first chip in said chip stack, and a lower surface of a second chip formed above said first chip in said chip stack,
wherein said upper and lower portions of said casing form the coolant inlet for transporting said coolant into said chip stack, and the coolant outlet for transporting said coolant out of said chip stack.

* * * * *